(12) United States Patent
Medlen et al.

(10) Patent No.: US 6,271,597 B1
(45) Date of Patent: Aug. 7, 2001

(54) METHODS FOR FORMING ELECTRICALLY CONDUCTIVE INTERCONNECTIONS AND ELECTRICALLY INTERCONNECTED SUBSTRATES

(75) Inventors: Curtis M. Medlen; Mark E. Tuttle, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/429,884

(22) Filed: Oct. 29, 1999

Related U.S. Application Data

(62) Division of application No. 09/022,962, filed on Feb. 12, 1998, now Pat. No. 6,110,760.

(51) Int. Cl.⁷ .......................... H01L 23/48; H01L 23/52; H01L 29/40
(52) U.S. Cl. .......................... 257/774; 257/778; 257/777; 257/783; 257/786
(58) Field of Search .................................. 257/778, 777, 257/783, 774, 786; 438/456

(56) References Cited

U.S. PATENT DOCUMENTS

| | | |
|---|---|---|
| 3,757,075 | 9/1973 | Munt . |
| 3,893,156 | 7/1975 | Riseman . |
| 4,157,932 | 6/1979 | Hirata . |
| 4,442,966 | 4/1984 | Jourdain et al. . |
| 4,570,329 | 2/1986 | Paine et al. . |
| 4,612,083 | 9/1986 | Yasumoto et al. . |
| 4,818,728 | 4/1989 | Rai et al. . |
| 4,878,611 | 11/1989 | LoVasco et al. . |
| 4,998,665 | * 3/1991 | Hayashi ............................... 228/180 |
| 5,034,799 | 7/1991 | Tomita et al. . |
| 5,196,371 | 3/1993 | Kulesza et al. . |
| 5,237,130 | 8/1993 | Kulesza et al. . |
| 5,279,989 | 1/1994 | Kim . |
| 5,431,328 | 7/1995 | Chang et al. . |
| 5,539,153 | 7/1996 | Schwiebert et al. . |
| 5,611,140 | 3/1997 | Kulesza et al. . |
| 5,658,830 | 8/1997 | Jeng . |
| 5,920,464 | 7/1999 | Yokoyama et al. . |

* cited by examiner

Primary Examiner—Steven Loke
Assistant Examiner—Douglas W. Owens
(74) Attorney, Agent, or Firm—Wells, St. John, Roberts, Gregory & Matkin P.S.

(57) ABSTRACT

Methods of forming electrically conductive interconnections and electrically interconnected substrates are described. In one implementation, a first substrate having an outer surface is provided and a layer of material is formed thereover. Openings are formed within the layer of material and conductive masses are formed within the openings. A second substrate having conductive interconnect surfaces is provided. The conductive interconnect surfaces are then contacted with the conductive masses and deformed thereby. In one aspect, the interconnect surfaces are deformed in part by portions of the layer of material proximate the conductive masses. In another aspect, the layer of material is removed and the interconnect surfaces are deformed by the conductive masses themselves.

24 Claims, 6 Drawing Sheets

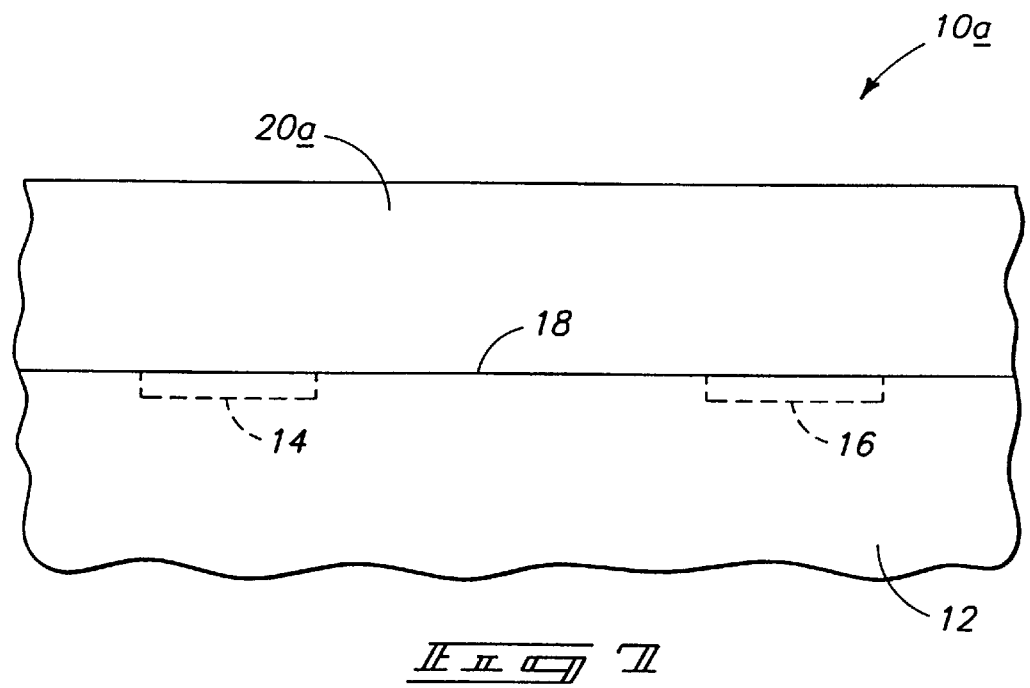
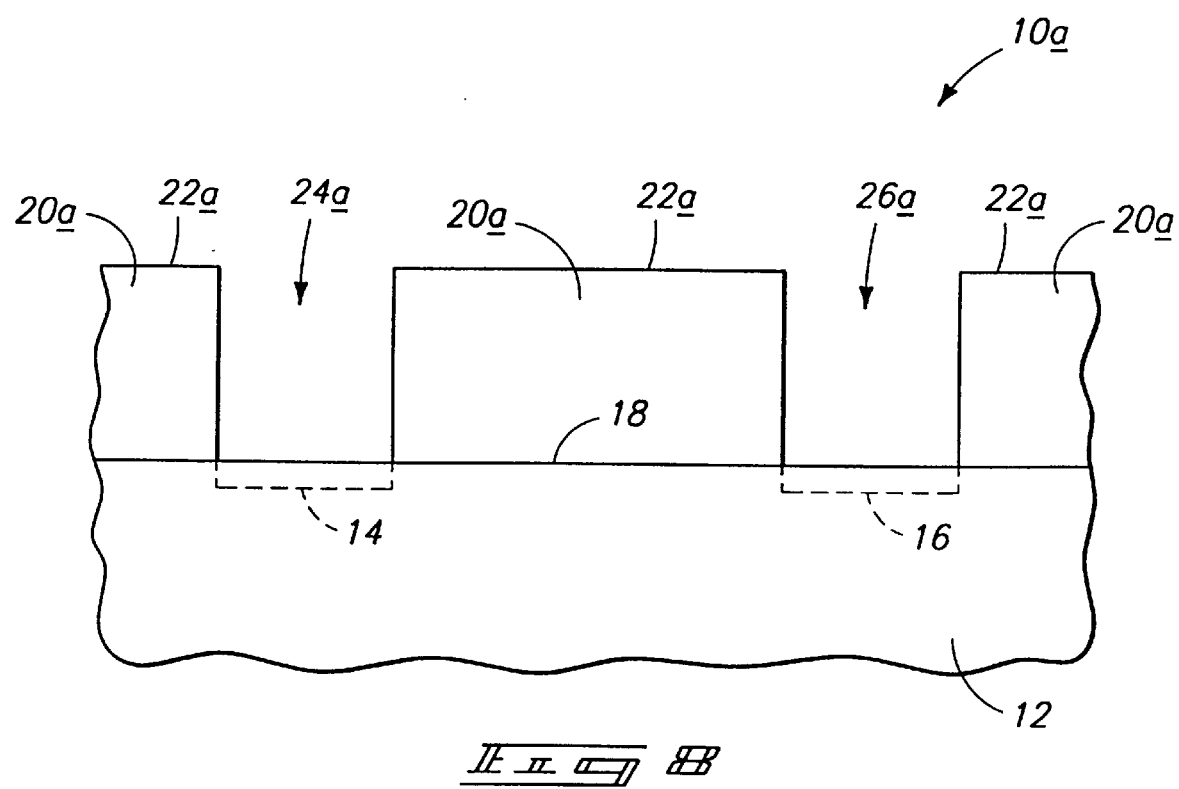

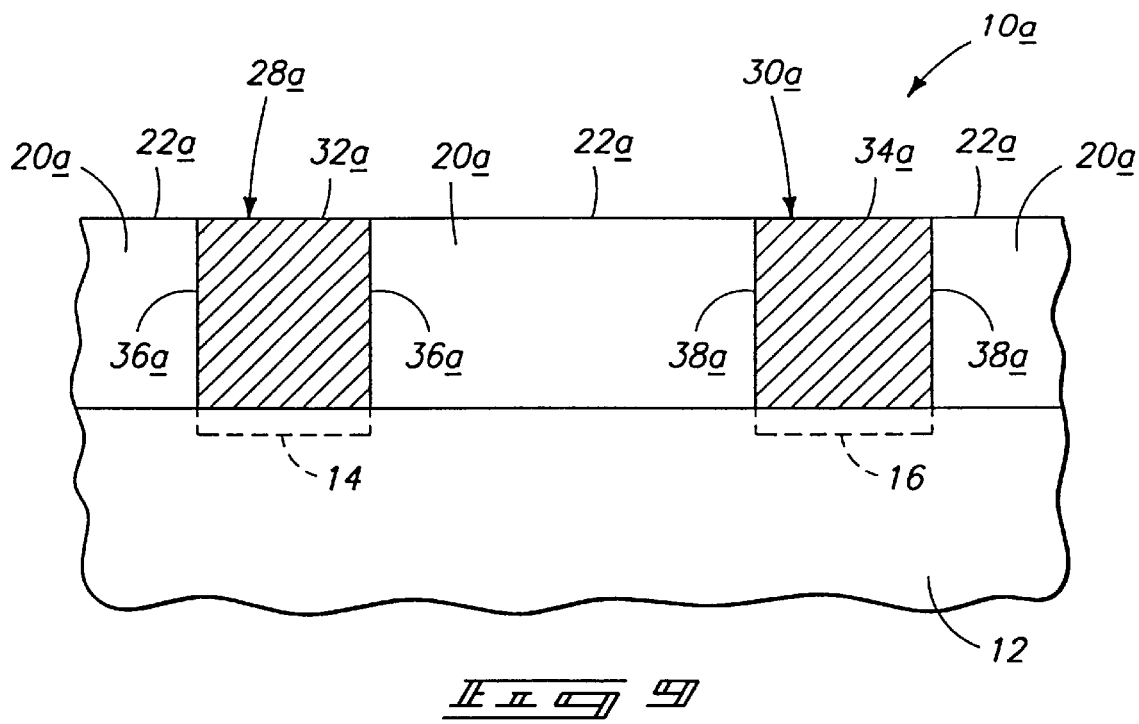
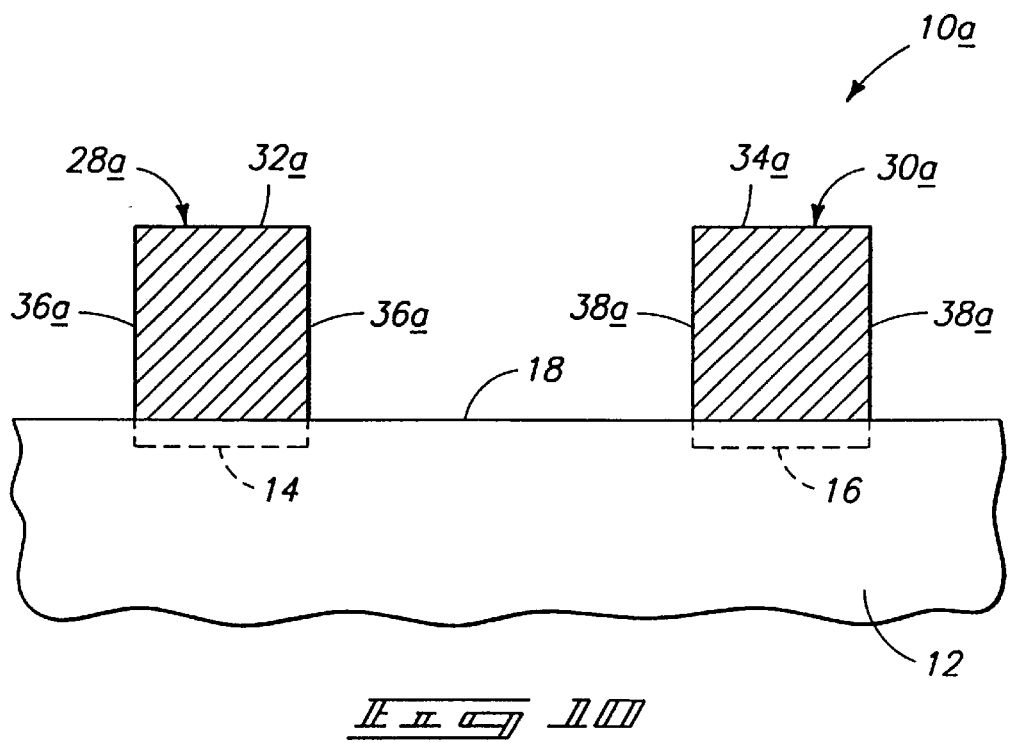

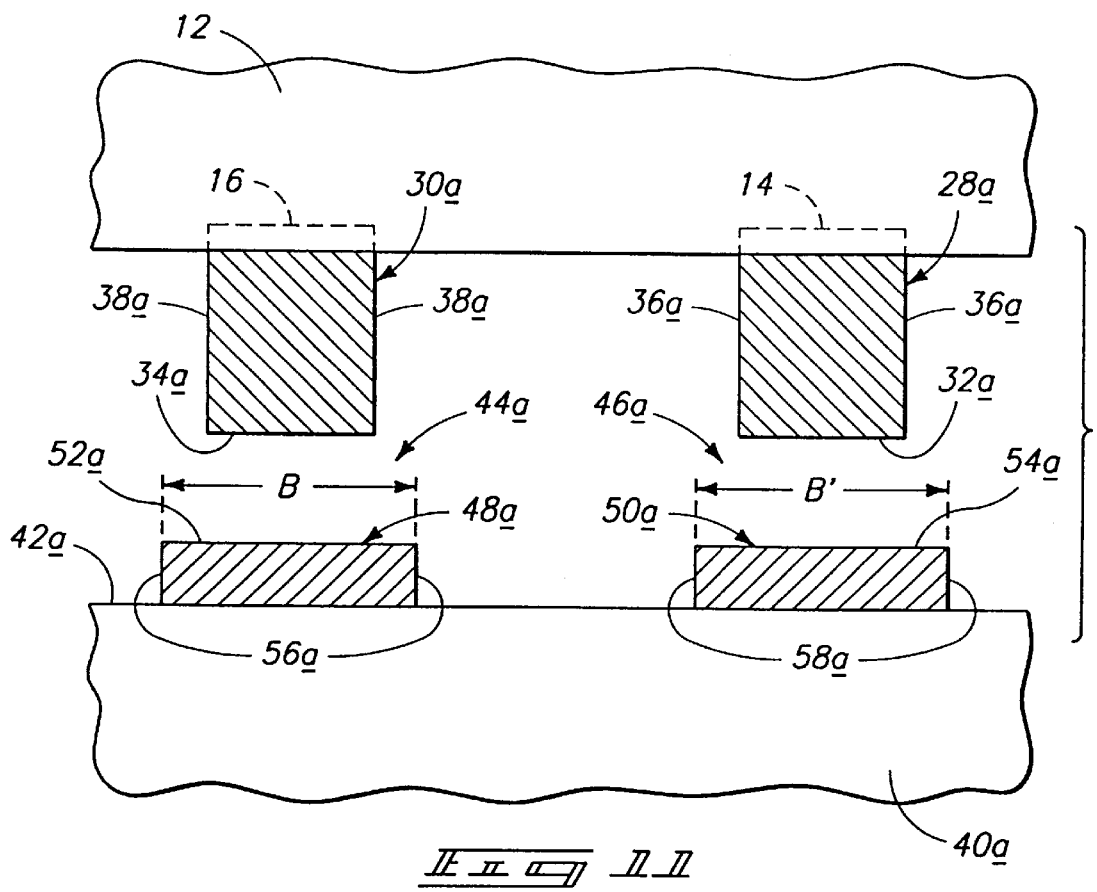
F I G. 11
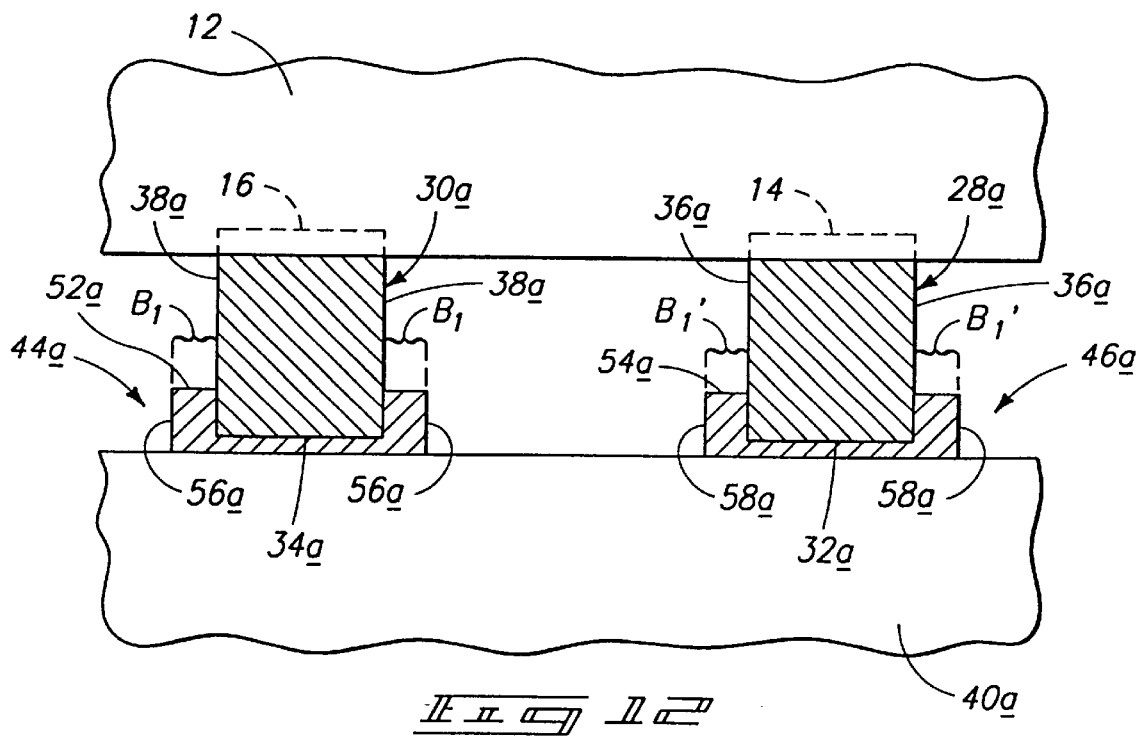
F I G. 12

METHODS FOR FORMING ELECTRICALLY CONDUCTIVE INTERCONNECTIONS AND ELECTRICALLY INTERCONNECTED SUBSTRATES

RELATED PATENT DATA

This patent resulted from a divisional application U.S. patent application Ser. No. 09/022,962, which was filed on Feb. 12, 1998, now U.S. Pat. No. 6,110,760, the disclosure of which is incorporated by reference.

TECHNICAL FIELD

This invention relates to methods of forming electrically conductive interconnections and electrically interconnected substrates.

BACKGROUND OF THE INVENTION

One method of integrated circuit interconnection is called flip chip bonding. Here, bumps of solder or other conductive material are deposited onto conductive pads of a semiconductor wafer or chip. After separation of individual dies from the wafer, the individual dies or chips are turned upside down, and the bumps are properly aligned with a metallization pattern on another substrate. The aligned bumps are then joined to appropriate points on the pattern.

This invention arose out of concerns associated with improving flip chip bonding techniques and the substrates which are interconnected thereby.

SUMMARY OF THE INVENTION

Methods of forming electrically conductive interconnections and electrically interconnected substrates are described. In one implementation, a first substrate having an outer surface is provided and a layer of material is formed thereover. Openings are formed within the layer of material and conductive masses are formed within the openings. A second substrate having conductive interconnect surfaces is provided. The conductive interconnect surfaces are then contacted with the conductive masses and deformed thereby. In one aspect, the interconnect surfaces are deformed in part by portions of the layer of material proximate the conductive masses. In another aspect, the layer of material is removed and the interconnect surfaces are deformed by the conductive masses themselves.

BRIEF DESCRIPTION OF THE DRAWINGS

Preferred embodiments of the invention are described below with reference to the following accompanying drawings.

FIG. 7 is a view of the FIG. 1 wafer fragment undergoing processing in accordance with another implementation of the invention.

FIG. 8 is a view of the FIG. 7 wafer fragment at a different processing step.

FIG. 9 is a view of the FIG. 7 wafer fragment at a different processing step.

FIG. 10 is a view of the FIG. 7 wafer fragment at a different processing step.

FIG. 11 is a view of the FIG. 7 wafer fragment at a different processing step.

FIG. 12 is a view of the FIG. 7 wafer fragment at a different processing step.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
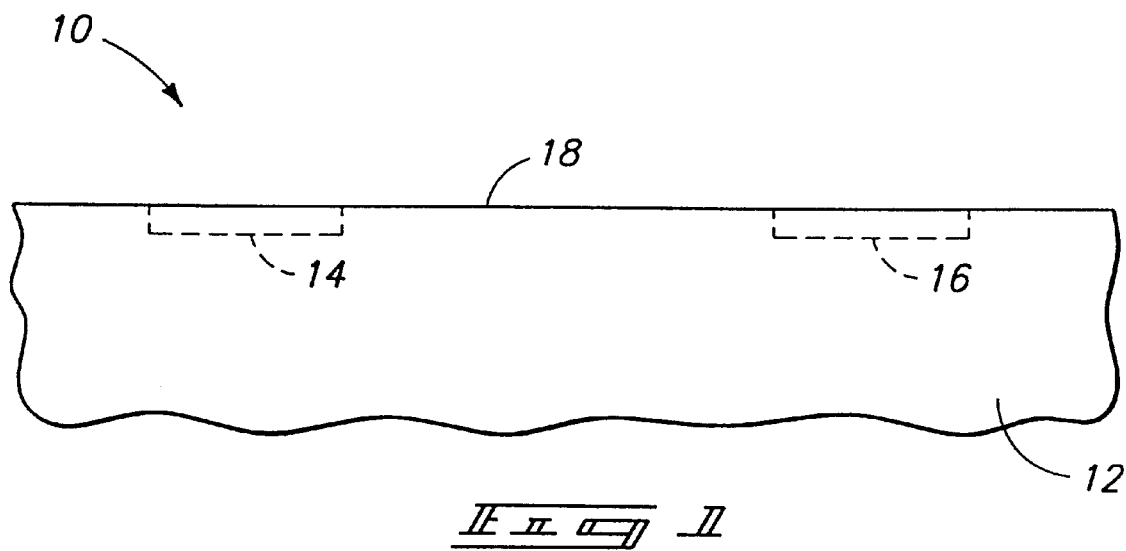
FIG. 1 is a diagrammatic sectional view of a semiconductor wafer fragment undergoing processing in accordance with one implementation of the invention.

Referring to FIG. 1, a semiconductor wafer fragment is shown generally at 10 and comprises a semiconductive substrate 12 which supports integrated circuitry which is not specifically shown. A pair of integrated circuitry bond pads 14, 16 are formed within and supported by substrate 12. The illustrated bond pads are disposed below a substrate outer surface 18. For purposes of the ongoing discussion, substrate 12 constitutes a first substrate.

Figure 2:
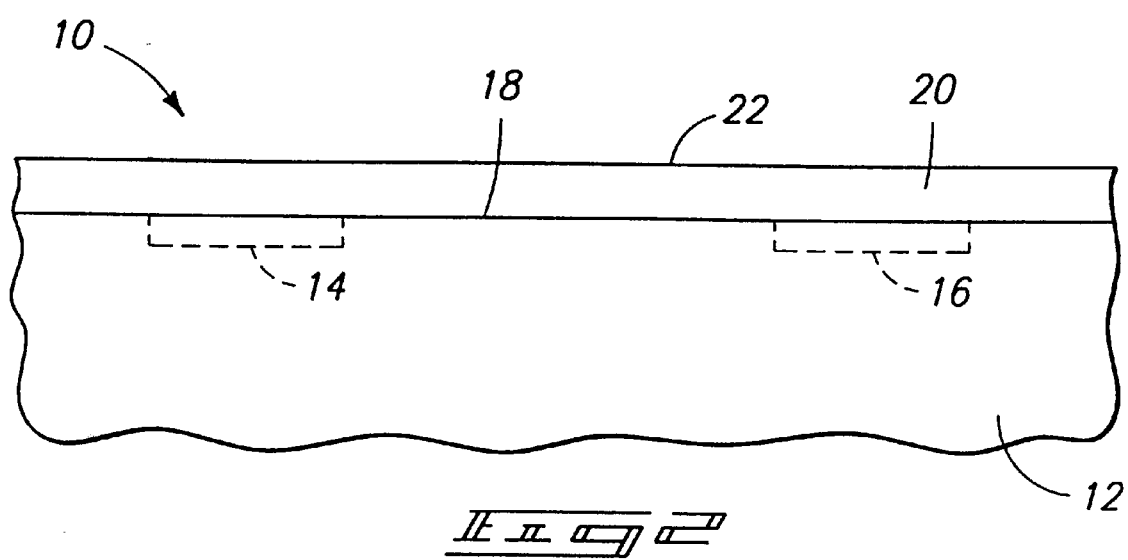
FIG. 2 is a view of the FIG. 1 wafer fragment at a different processing step.

Referring to FIG. 2, a layer of material 20 is formed over outer surface 18 and bond pads 14, 16. The illustrated layer has a generally planar outer surface 22. Exemplary materials for layer 20 include insulative materials and/or photoresist. Layer 20 is formed to a height over outer surface 18 which is a desired height for conductive masses which are to be subsequently formed. An exemplary height is between about 10–30 $\mu$m.

Figure 3:
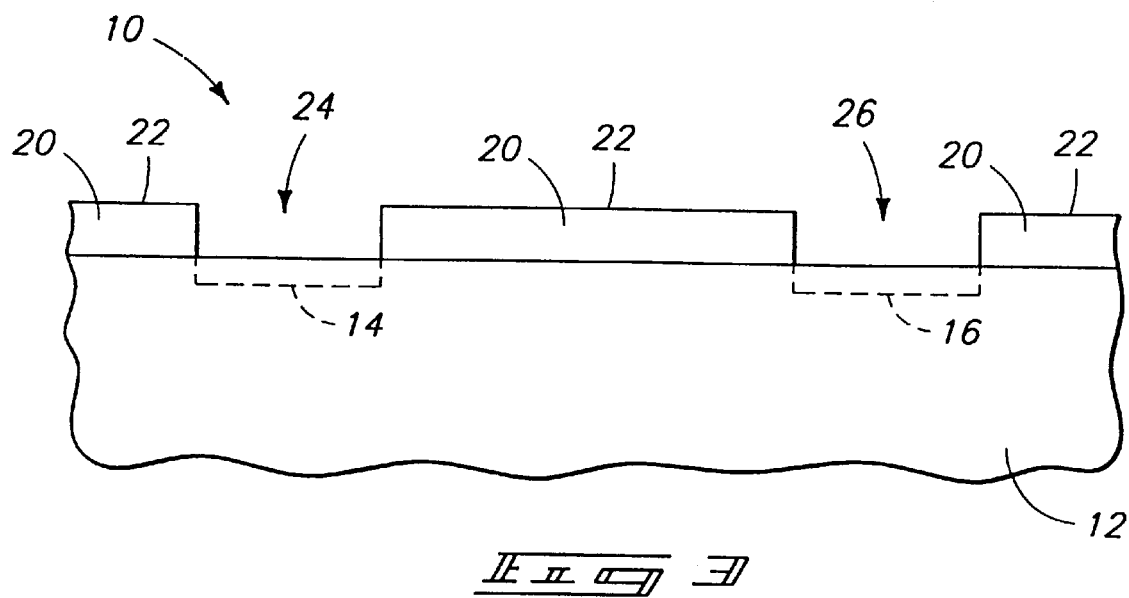
FIG. 3 is a view of the FIG. 1 wafer fragment at a different processing step.

Referring to FIG. 3, portions of layer 20 are removed thereby forming openings 24, 26 and outwardly exposing selected substrate portions which include respective bond pads 14, 16. If layer 20 is photoresist, it would simply be patterned and portions removed in accordance with conventional photoresist processing. If layer 20 is a material other than photoresist, it would be patterned and etched accordingly.

Figure 4:
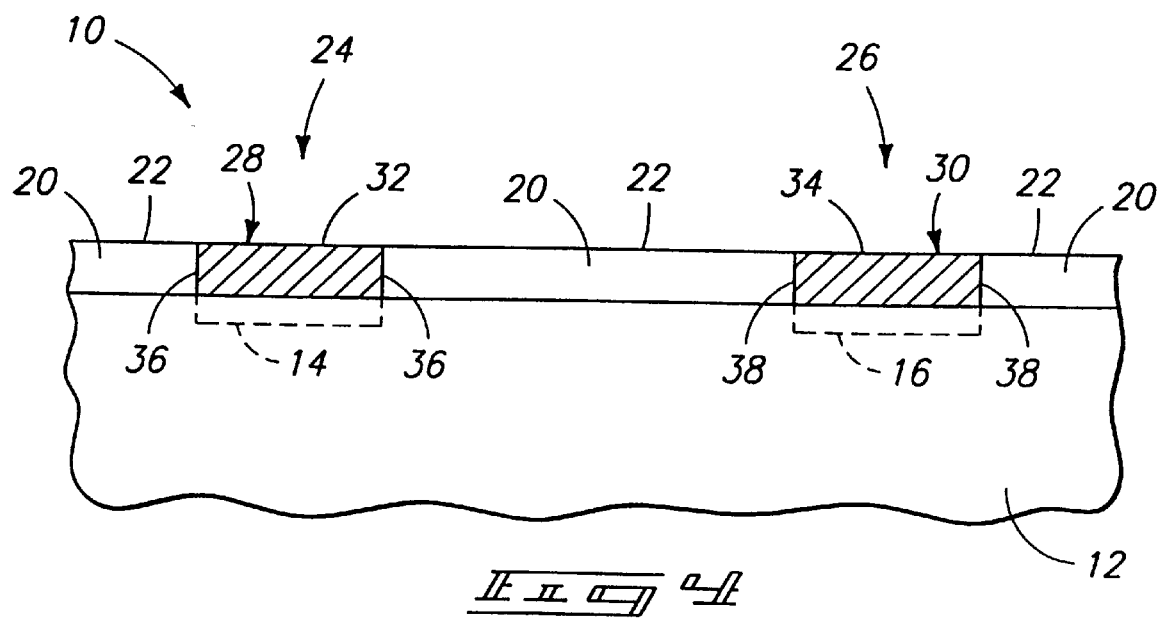
FIG. 4 is a view of the FIG. 1 wafer fragment at a different processing step.

Referring to FIG. 4, conductive material is provided into the openings and forms respective conductive masses 28, 30 received within layer 20. The conductive material replaces the portions of layer 20 which were removed to form openings 24, 26. In one aspect, the conductive material which comprises each mass is homogeneously distributed within layer 20 sufficiently to fill the respective openings. To achieve adequate filling of the openings, a non-solidified conductive material such as a silver-filled polymer epoxy material can be used. Exemplary methods for filling openings 24, 26 include stencil printing and screen printing. In addition, conductive material can be deposited into the openings and over the substrate and subsequently planarized as by chemical-mechanical or other polishing. If necessary, the substrate can be exposed to conditions, such as curing conditions, which are effective to harden the conductive material within openings 24, 26.

The illustrated masses have outermost surfaces which include respectively, outwardly exposed uppermost surface portions 32, 34 and sidewalls or sidewall portions 36, 38. Uppermost surface portions 32, 34 are generally planar and coplanar with proximate portions of outer surface 22. The individual sidewall portions for each mass face generally oppositely one another and extend generally transversely away from the substrate where each joins therewith.

Figure 5:
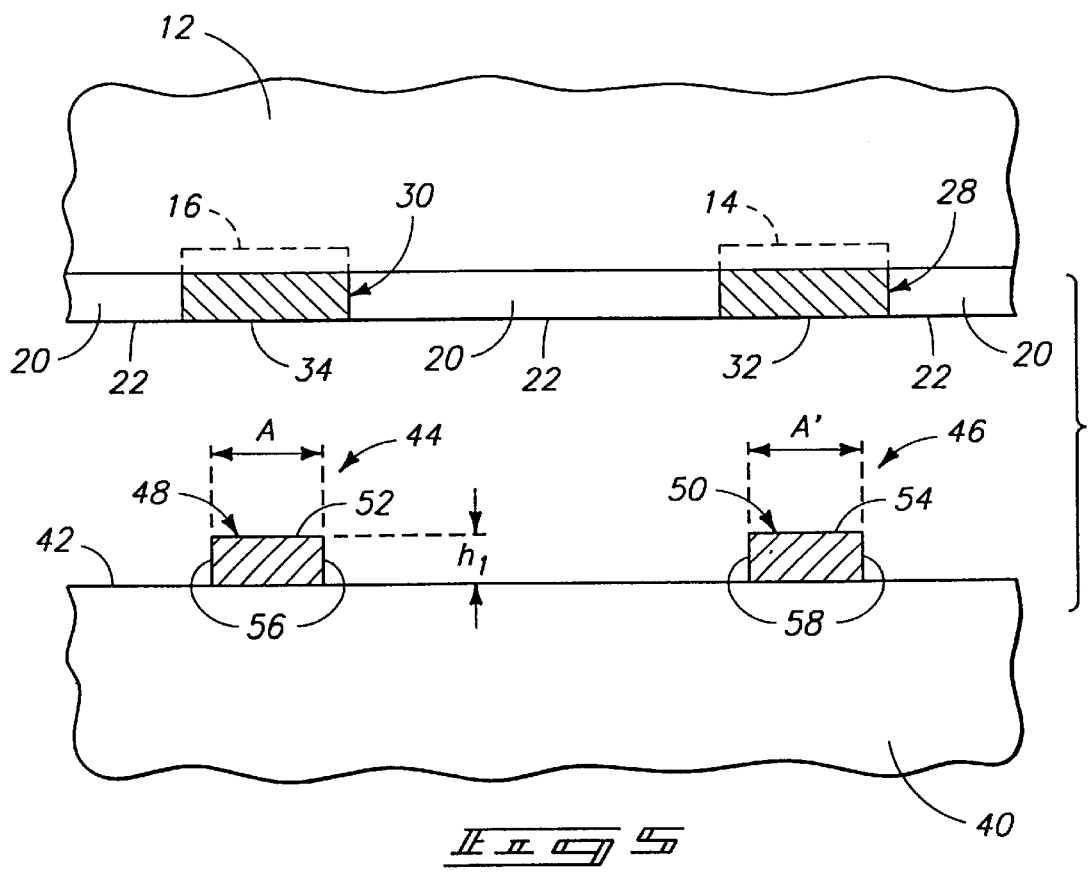
FIG. 5 is a view of the FIG. 1 wafer fragment at a different processing step.

Referring to FIG. 5, substrate 12 is inverted or flipped over a second substrate 40. Second substrate 40 includes an outer surface 42. A pair of conductive structures 44, 46 are formed over substrate 40 and comprise respective conductive interconnect surfaces 48, 50. The interconnect surface of each structure defines a respective shape which extends away from outer surface 42 and includes respective uppermost surfaces 52, 54. The uppermost surfaces face generally away from substrate 40 and join with respective sidewalls 56, 58. Structures 44, 46 have a surface area consisting of a first portion which makes physical contact with outer surface 42. The first portion corresponds to that portion of a structure's surface area which is disposed atop and in physical contact with substrate 40. The structures also include a second portion which does not make physical contact with substrate 40. Such second portions include first surface areas A, A' which are defined by uppermost surfaces 52, 54 respectively and sidewalls 56, 58. The second portions are substantially outwardly exposed. The uppermost surfaces also define respective first heights $h_1$ over outer surface 42. In one aspect, structures 44, 46 comprise homogeneously distributed conductive material.

Figure 6:
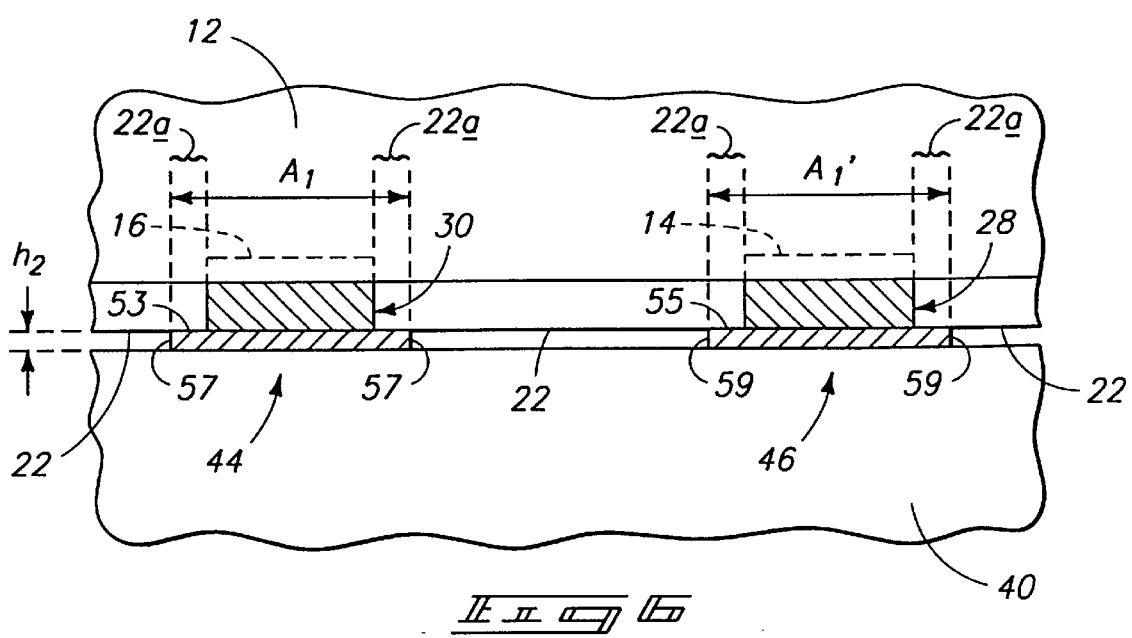
FIG. 6 is a view of the FIG. 1 wafer fragment at a different processing step.

Referring to FIG. 6, the substrates are moved toward one another and the respective interconnect surfaces 48, 50 (FIG. 5) are physically contacted with the outermost surfaces of respective masses 30, 28. Such moving changes the shapes of conductive structures 44, 46 and accordingly deforms interconnect surfaces 48, 50. In the illustrated example, the conductive structures are squeezed between the first and second substrates. This generally flattens the structures relative to the structures' shapes. Portions 22a of outer surface 22 also engage the conductive structures to effect the deformation thereof. Such deformation effectively defines different respective uppermost surfaces 53, 55, and different sidewalls 57, 59. Uppermost surfaces 53, 55 respectively define different second surface areas $A_1$, $A_1'$ which are greater than first surface areas A, A' respectively. Accordingly, uppermost surfaces 53, 55 define respective second heights $h_2$ which are less than first heights $h_1$.

Referring to FIG. 7, an alternate embodiment is set forth generally at 10a. Like numerals from the above-described embodiment have been utilized where appropriate, with differences being indicated by the suffix "a" or with different numerals. Accordingly, a layer of material 20a is formed over first substrate 12. Layer 20a can be formed to a height from between about 100 $\mu$m to 200 $\mu$m.

Referring to FIG. 8, openings 24a, 26a are formed in layer 20a and outwardly expose bond pads 14, 16.

Referring to FIG. 9, conductive masses 28a, 30a are formed over substrate 12 and received within layer 20a. Accordingly, the masses have respective heights which are defined by each masses' vertically extending sidewalls 36a, 38a which are substantially the same as the height of layer 20a, e.g., between about 100 $\mu$m to 200 $\mu$m.

Referring to FIG. 10, material of layer 20a is removed sufficiently to leave masses 28a, 30a over substrate 12. Layer 20a can be removed through conventional techniques such as resist stripping (when photoresist is used) or through a selective etch of the layer relative to material of both the masses and the outer surface of substrate 12.

Referring to FIG. 11, a second substrate 40a is provided with conductive structures 44a, 46a thereover. The conductive structures include uppermost surfaces 52a, 54a which define respective surface areas B, B'.

Referring to FIG. 12, substrates 12 and 40a are moved toward each other and masses 30a, 28a are respectively extended into and deform conductive structures 44a, 46a. The masses are extended into the respective structures to below the uppermost surfaces 52a, 54a thereof a distance which is less than the respective height of each mass. The uppermost surface 34a, 32a of each mass is disposed closer to the second substrate than some portions of sidewalls 56a, 58a. Accordingly, the respective structures are bonded with the uppermost surface 52a, 54a of each mass, as well as a portion of at least one of the sidewalls of each mass. In the illustrated example, portions of each sidewall of each mass are bonded with the respective conductive structures. Accordingly, less than all of each mass sidewall has conductive material of an associated conductive structure disposed laterally adjacent thereto and is disposed laterally between respective structure sidewalls 56a, 58a. The portions of each mass which are not disposed within the conductive structures are disposed elevationally over those portions which are disposed within the conductive structures.

Each conductive structure 44a, 46a is deformed by and through the engagement with the respective conductive interconnect surfaces of the conductive masses. Accordingly, such defines respective second surface areas $B_1$ (for conductive structure 44a) and $B_1'$ (for conductive structure 46a) which are less than the respective first surface areas B, B' in FIG. 11.

The above-described embodiments provide flip chip bonding methods which improve upon techniques which are currently utilized. Material of layers 20, 20a is easily formed through commonly-employed techniques and formation of the masses therewithin is thought to be much simpler and more cost effective than current methods. In addition, desirable epoxy connections can be achieved without significant additional capacitance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A pair of electrically interconnected substrates comprising:

a first substrate having an outer surface;

a conductive mass of material disposed over the outer surface and having a generally planar uppermost surface;

a second substrate having a conductive structure disposed thereon, the conductive structure having a planar uppermost interconnect surface and sidewalls which are joined with the interconnect surface and extend between the interconnect surface and the second substrate, the sidewalls and interconnect surface being outwardly exposed; and the conductive mass of material being received within the conductive structure, the uppermost surface of the conductive mass being disposed closer to the second substrate than the conductive structure's interconnect surface.

2. The substrates of claim 1, wherein the conductive mass is received laterally between the conductive structure's sidewalls.

3. The substrates of claim 1, wherein the conductive structure comprises conductive epoxy.

4. The substrates of claim 1, wherein the conductive structure is deformed by squeezing the conductive mass of material into the conductive structure.

5. The substrates of claim 1, wherein the conductive structure comprises non-solidified conductive material.

6. The substrates of claim 1, wherein the conductive structure comprises silver-filled polymer.

7. A pair of electrically interconnected substrates comprising:

a first substrate having an outer surface;

a conductive mass of material disposed over the outer surface and having a generally planar uppermost surface;

a second substrate having an outer surface and a conductive structure disposed thereon, the conductive structure having a conductive structure surface area consisting of a first portion which makes physical contact with the second substrate's outer surface and a second portion which does not make physical contact with the second substrate's outer surface, the second portion being defined at least in part by outwardly-exposed, generally vertically-extending sidewalls which extend away from the second substrate's outer surface; and the conductive mass of material being received within the conductive structure, the uppermost surface of the conductive mass being disposed closer to the second substrate outer surface than at least some portions of the vertically-extending sidewalls.

8. The substrates of claim 7, wherein the conductive mass is received laterally between the vertically-extending sidewalls.

9. The substrates of claim 7, wherein the conductive structure comprises conductive epoxy.

10. The substrates of claim 7, wherein the conductive structure is deformed by squeezing the conductive mass of material into the conductive structure.

11. The substrates of claim 7, wherein the conductive structure comprises non-solidified conductive material.

12. The substrates of claim 7, wherein the conductive structure comprises silver-filled polymer.

13. A pair of electrically interconnected substrates comprising:

a first substrate having an outer surface;

a layer of material disposed over the first substrate's outer surface and having a material outer surface disposed over the first substrate's outer surface;

a conductive mass of material received within an opening formed in the layer of material and having a generally planar uppermost surface which is generally coplanar with the material outer surface; and a second substrate having a conductive structure disposed thereon, the conductive structure having a conductive structure uppermost surface, the uppermost surface of the conductive mass and at least a portion of the outer surface of the layer of material being in physical contact with the conductive structure uppermost surface.

14. The substrates of claim 13, wherein the uppermost surface of the conductive mass and the material outer surface squeezes and deforms the conductive structure.

15. The substrates of claim 13, wherein the conductive structure comprises conductive epoxy.

16. The substrates of claim 13, wherein the conductive structure is deformed by squeezing the conductive mass of material into the conductive structure.

17. The substrates of claim 13, wherein the conductive structure comprises non-solidified conductive material.

18. The substrates of claim 13, wherein the conductive structure comprises silver-filled polymer.

19. A pair of electrically interconnected substrates comprising:

a first substrate having an outer surface;

a conductive mass of material disposed over the outer surface and having a first generally planar uppermost interconnect surface and sidewalls which are joined with the uppermost in surface and extend between the uppermost surface and the first substrate, the sidewalls and interconnect surface being outwardly exposed;

a second substrate having a conductive structure disposed thereon, the conductive structure having a second planar uppermost interconnect surface; and the conductive structure being received within the conductive mass of material, the conductive mass of material being deformed by the conductive structure's interconnect surface to have a second uppermost surface having increased surface area relative to the first generally planar uppermost surface.

20. The substrates of claim 19, wherein the conductive structure is received laterally between the conductive mass's sidewalls.

21. The substrates of claim 19, wherein the conductive mass comprises conductive epoxy.

22. The substrates of claim 19, wherein the conductive mass is deformed by squeezing the conductive structure into the conductive mass of material.

23. The substrates of claim 19, wherein the conductive mass comprises non-solidified conductive material.

24. The substrates of claim 19, wherein the conductive mass comprises silver-filled polymer.

* * * * *

UNITED STATES PATENT AND TRADEMARK OFFICE
CERTIFICATE OF CORRECTION

PATENT NO.      : 6,271,597 B1
DATED           : August 7, 2001
INVENTOR(S)     : Curtis M. Medlen and Mark E. Tuttle It is certified that error appears in the above-identified patent and that said Letters Patent is hereby corrected as shown below:

Title page,
Title, delete "For" and insert -- Of --.

Column 1,
Title, delete "For" and insert -- Of --.

Column 6,
Line 28, delete "in" and insert -- interconnect --.
Line 29, insert -- interconnect -- after "uppermost".
Line 32, delete "second".
Line 37, insert -- generally planar -- after "second".
Line 37, insert -- interconnect -- after "uppermost".
Line 39, insert -- interconnect -- after "uppermost".

Signed and Sealed this

Twenty-sixth Day of February, 2002

*Attest:*

JAMES E. ROGAN
*Attesting Officer*     *Director of the United States Patent and Trademark Office*